United States Patent
Message Thebaudeau

(10) Patent No.: US 10,263,423 B2
(45) Date of Patent: Apr. 16, 2019

(54) METHOD FOR CONTROLLING AN ELECTRICAL INSTALLATION FROM A REMOTE LOCATION

(71) Applicant: Schneider Electric Industries SAS, Rueil-Malmaison (FR)

(72) Inventor: Laetitia Message Thebaudeau, Dizimieu (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 132 days.

(21) Appl. No.: 15/591,359

(22) Filed: May 10, 2017

(65) Prior Publication Data

US 2018/0013284 A1 Jan. 11, 2018

(30) Foreign Application Priority Data

Jul. 7, 2016 (FR) ...................... 16 56514

(51) Int. Cl.
*H02J 3/00* (2006.01)
*H02J 13/00* (2006.01)
(Continued)

(52) U.S. Cl.
CPC ............... *H02J 3/00* (2013.01); *G01R 31/00* (2013.01); *G01R 31/44* (2013.01); *H02J 3/06* (2013.01);
(Continued)

(58) Field of Classification Search
CPC . H02J 3/00; H02J 9/06; H02J 13/0006; G01R 31/44; G01R 31/00
See application file for complete search history.

(56) References Cited

U.S. PATENT DOCUMENTS 8,700,224 B2 * 4/2014 Mathiowetz ............. H02J 3/14
700/295
2013/0231756 A1 9/2013 Houdray et al.

FOREIGN PATENT DOCUMENTS

EP 2 390 981 A1 11/2011
FR 2 685 830 A1 7/1993
(Continued)

OTHER PUBLICATIONS

French Preliminary Search Report (with Written Opinion) dated Mar. 10, 2017 in French Application 16 56514 filed on Jul. 7, 2016 (with English Translation of Categories of Cited Documents).

*Primary Examiner* — Jared Fureman
*Assistant Examiner* — Michael Warmflash
(74) *Attorney, Agent, or Firm* — Oblon, McClelland, Maier & Neustadt, L.L.P.

(57) ABSTRACT

A method for controlling an electrical installation from a remote control station is provided, the installation including a coupling network powering one or more electrical loads, a main switch to connect a main power source to the network, and an auxiliary switch to connect an auxiliary power source to the network, the method including synchronizing the auxiliary power source with the main power source including a phase of measuring electric data relative to the main power source and to the auxiliary power source and a verification phase, from the remote station, to ensure that the measured data relative to the main and auxiliary power sources is compatible; sending an order to close the auxiliary switch from the remote control station; sending an order to open the main switch from the remote station; and checking, from the remote station, that the loads are correctly powered by the auxiliary power source.

10 Claims, 2 Drawing Sheets

(51) Int. Cl.
*G01R 31/00* (2006.01)
*H02J 9/06* (2006.01)
*G01R 31/44* (2006.01)
*H02J 3/06* (2006.01)
*H02J 3/08* (2006.01)
*H02J 3/40* (2006.01)

(52) U.S. Cl.
CPC *H02J 3/08* (2013.01); *H02J 3/40* (2013.01); *H02J 9/06* (2013.01); *H02J 13/0006* (2013.01); *H02J 13/0017* (2013.01)

(56) References Cited

FOREIGN PATENT DOCUMENTS

| | | | | |
|---|---|---|---|---|
| FR | 2685830 A1 | * | 7/1993 | ............. H02J 9/062 |
| FR | 2 987 690 A1 | | 9/2013 | |

* cited by examiner

METHOD FOR CONTROLLING AN ELECTRICAL INSTALLATION FROM A REMOTE LOCATION

TECHNICAL FIELD OF THE INVENTION

The present invention relates to a method for controlling an electrical installation from a remote location such as a remote operating or monitoring-control centre that is located a certain distance from the electrical installation. The invention particularly relates to the switchover control of the connection of a substation between a medium-voltage or high-voltage main electrical network, i.e. greater than 1000 V, and a backup auxiliary power source, particularly in order to conduct a preventive maintenance operation.

PRIOR ART

In a known manner, when a substation is able to connect to a backup auxiliary power source in the event of a loss of the main electrical power supply network, it is desirable to periodically check that this auxiliary power supply starts and couples correctly, so as to ensure that the main network switches over properly to the auxiliary power source when needed (in the event of failure of the main network, for example). Depending on the needs of the installation, the auxiliary power source may include one or more auxiliary power supply generators, such as a generating unit or a genset.

This periodic check, carried out on a monthly basis for example, generally leads to a maintenance operation on the substation site with operators travelling to this site, and also requires that the main power supply network be interrupted. This thus involves special logistics and presents the drawbacks of having to dispatch crews on site and to momentarily disconnect the electric loads supplied by the substation.

Generally speaking, the periodic maintenance operation is performed by the operators who first disconnect the main network, then perform a load shedding operation, if necessary (depending on the power of the auxiliary generator), then couple the unshed loads to the auxiliary generator, and then start the latter to ensure that it operates correctly. Conversely, the loads must then be uncoupled from the generator, load shedding interrupted, and the loads switched back over to the main network. This periodic procedure thus results in the power to the loads being interrupted twice in succession.

DISCLOSURE OF THE INVENTION

The purpose of the invention is therefore to avoid the aforementioned drawbacks, i.e. to avoid interruptions in the supply of power to unshed loads and the mobilisation of operators to the site during these periodic maintenance operations.

To do this, the invention describes a method for controlling an electrical installation from a remote control station, the electrical installation comprising a coupling network supplying one or more electrical loads, a main switch to connect a main power source to the coupling network and an auxiliary switch to connect an auxiliary power source to the coupling network. The control method includes a step to synchronise the auxiliary power source with the main power source comprising a phase of measuring electric data relative to the main power source and to the auxiliary power source and a verification phase, performed from the remote control station, to ensure that the measured electric data relative to the main power source and to the auxiliary power source are compatible. The control method then includes a step to send an order to close the auxiliary switch, from the remote control station, a step to send an order, from the remote control station, to open the main switch, from the remote control station, and a step to check that the load or loads are powered by the auxiliary power source.

According to a characteristic of the invention, if, during the verification phase, the measured electric data relative to the main power source and to the auxiliary power source are not compatible, the synchronising step further comprises a phase of correcting, from the remote control station, the parameters relative to the auxiliary power source.

According to a characteristic of the invention, after the checking step, the method then includes a second step to synchronise the auxiliary power source with the main power source, comprising a phase to measure electric data relative to the main power source and to the auxiliary power source and a verification phase, performed from the remote control station, to ensure that the measured electric data of the main power source and the auxiliary power source are compatible. After the second synchronisation phase, the method includes a step to send an order to close the main switch, from the remote control station, then a step to send an order to open the auxiliary switch from the remote control station.

According to a characteristic of the invention, the electrical installation has several loads distributed between so-called priority loads and so-called non-priority loads, and the method comprises a step to determine a power consumed by the priority loads and a decision-making step that authorises the implementation of the control method only if the power consumed by the priority loads is less than an available power supplied by the auxiliary power source.

In the case where each load is connected to the electrical network by a connection switch, the method comprises a step to determine a power consumed by the priority loads and by non-priority loads, and a selective disconnection step that allows one or more connection switches to be opened, from the remote control station, so that the sum of the power consumed by the priority loads and by the non-priority loads is less than the available power supplied by the auxiliary power source.

If the electrical network also has a coupling switch between the priority loads and the non-priority loads, the method comprises a step to determine a power consumed by the priority loads and by non-priority loads, and a step to open the coupling switch, from the remote control station, to disconnect the non-priority loads, in the case where the sum of the power consumed by the priority loads and the non-priority loads is greater than the available power supplied by the auxiliary power source.

According to a characteristic of the invention, the method also has a preliminary step to send an order to the auxiliary generator(s) of the auxiliary power source, from the remote control station, and a final step to send an order to stop the auxiliary generator(s) of the auxiliary power source, from the remote control station.

BRIEF DESCRIPTION OF FIGURES

Other characteristics and advantages will be provided in the following detailed description when taken in conjunction with the accompanying drawings, wherein.

DETAILED DESCRIPTION OF AT LEAST ONE EMBODIMENT

Figure 1:
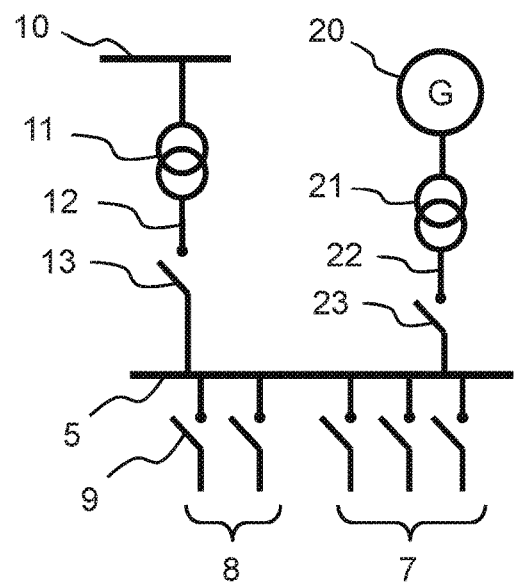
FIG. 1 represents a simplified diagram of an electricity distribution system with a coupling network that can be supplied from a main power source and an auxiliary power source.

In reference to FIG. 1, an electricity distribution installation has an electrical coupling network 5 which can be supplied by two separate power sources: a so-called main power source that is an electrical distribution network 10 such as the public distribution network, and a so-called auxiliary power source that comprises an auxiliary generator 20 such as a generating unit, a genset, or a backup generator.

The electrical coupling network 5 is connected to the main power source 10 through a main distribution line 12 that conventionally includes various devices, such as a transformer 11 and at least a main switch 13, for example. Furthermore, the coupling network 5 is connected to the auxiliary power source through an auxiliary distribution line 22 that conventionally includes various devices, such as a transformer 21 and at least an auxiliary switch 23, for example. Other connection switches can also exist, notably between the distribution network 10 and the transformer 11, although are not represented in FIG. 1 for the sake of simplicity. In this document, the term "switch" designates disconnector, circuit breaker, circuit breaker-disconnector or switch-disconnector type device.

The coupling network 5 makes it possible to supply electricity to various loads 7, 8. Optionally, the loads 7, 8 can be divided into several categories, namely the so-called priority loads 7, to which the permanent supply of electricity is given priority, and the so-called non-priority loads 8, which can be shed based on the electrical power available on the coupling network 5. In the example of FIG. 1, all the loads 7, 8 are individually connected to the coupling network 5 via a connection switch 9.

The auxiliary power source can indifferently comprise one or more auxiliary generators connected in parallel on the coupling network 5. Thus, in the example of FIG. 2, the auxiliary power source comprises two auxiliary generators 20, 30, respectively, which are connected in parallel on the coupling network 5 via an auxiliary distribution line 22, 32, respectively, a transformer 21, 31, respectively, and an auxiliary switch 23, 33, respectively. Of course, this configuration with several auxiliary generators 20, 30 makes it possible to have a greater amount of available power to supply the loads 7, 8 in the event of failure of the main power source 10.

In normal operating mode, the coupling network 5 is powered by the main power source 10, which is generally powerful enough to supply all the loads 7, 8 connected to the coupling network 5. The auxiliary power source is thus disconnected as it is typically used as a backup power supply source in case the main power source 10 fails. In normal operating mode, the main switch 13 is thus in closed (or pass-through) position and the auxiliary switch(es) 23, 33 is/are in open (or blocking) position. In the variant shown in FIG. 2 (see below) when there is a coupling switch 3, it is also in a closed (or pass-through) position, in normal operating mode.

However, the auxiliary power source may also possibly be temporarily used to supplement insufficient available power from the main power source 10, for example to prevent a blackout of the main network during an occasional overload or a congestion upstream.

To ensure that the auxiliary power source is available at all times, i.e. to ensure that, in the event of failure of the main power source 10, the installation will be well able to switch over to the auxiliary power source to supply all or part of the loads 7, 8, the start-up and coupling procedures of the auxiliary generator(s) 20, 30 should be regularly checked.

The electricity distribution system is controlled from a remote control station (not shown in the figures), such as a supervisory control and data acquisition (SCADA) control station in a remote operating centre, for example. This remote control station communicates with the various devices of the electrical installation via a wired and/or wireless communications network and is thus notably able to remotely send open and close orders to the various switches of the installation. Furthermore, the remote control station communicates with differential measuring devices or detection relays of the installation to receive all the measurements or all the relevant states, notably voltage, current, and frequency measurements of the various electrical networks and lines.

The control method according to the invention thus aims to conduct a periodic preventive maintenance operation, carried out on a monthly basis for example, involving checking the availability and the correct operation of the auxiliary power source, without disrupting the power supply of the loads, particularly priority loads 7, and without requiring local intervention by the operators. The maintenance operation is advantageously conducted from the remote control station that communicates with local automated controllers managing the electrical installation.

It is assumed that at the start of the control method, the electrical installation is in normal operation, i.e. that the coupling network 5 is only connected to the main power source 10, and that the auxiliary power source has a single auxiliary generator 20. When a maintenance operation is decided upon, the auxiliary generator 20 must first be started, if this is not already the case. Start-up can be performed by an order to start the auxiliary generator 20 sent from the remote control station.

Once the auxiliary generator 20 is started, the control method provides for a first step to synchronise the auxiliary generator 20 with the main power source 10. This first step synchronisation step is required before the power supply of the coupling network 5 can be switched from the main power source to the auxiliary power source. As an aim of the invention is not to interrupt the power supply of the priority loads during the maintenance operation, this means that, for at least a short time period, the coupling network 5 will be connected to both the main power source and to the auxiliary power source, i.e. that the main switch 13 and the auxiliary switch 23 will be in closed position simultaneously for a few milliseconds, or for even a few seconds.

This first step synchronisation step thus has a phase of measuring electric data relative to the main power source and to the auxiliary power source and a verification phase, from the remote control station, to ensure that the electric data measured from the main power source side are compatible with the measured electric data of the auxiliary power source side, in order to authorise the auxiliary switch 23 to close and to thus have the main power source and the auxiliary power source connected to the coupling network 5 at the same time.

If this check is not performed, disruption of the installation may occur and the equipment of the electrical installation (including the auxiliary generator and the loads) run the risk of being damaged. To consider that the measured electric data are compatible, a check must be performed to determine that the voltages on the main power source side and the auxiliary power source side have the same amplitude, the same frequency, the same angular phase, the same waveform and, in the case of multiphase systems, the same phase rotation sequence.

The last two conditions (namely "waveform" and "phase sequence") are elements established by the construction of the auxiliary generator and its connections to the electrical installation. It can thus be considered that these conditions were checked when the installation was commissioned and do not need to be systematically re-checked. However, the first three conditions (namely amplitude, frequency, and angular phase) must be systematically checked each time the main power source and the auxiliary power source are connected in parallel.

If the voltage amplitudes of the main power source and the auxiliary power source are not sufficiently close, then a sudden flow of reactive power of several mega volt-amperes (reactive) (MVAr) may appear when the auxiliary switch is closed. The tolerances on these amplitude differences are based on the parameters of the generator and those of the network. It is generally considered that a maximum deviation of +/−5% is allowable in order for the voltage amplitudes to be compatible. This difference between the amplitudes is checked with regard to the maximum and root-mean-square (rms) voltage values.

If the frequencies on the main power source side and the auxiliary power source side do not coincide before the auxiliary switch closes, then a sudden flow of active power of several megawatts (MW) can appear in an attempt to establish a common frequency on both sides. As above, the acceptable difference is specific and depends both the parameters of the auxiliary generator and those of the main network. Generally speaking, it is considered that the difference between the frequencies should be less than 1 Hz, or even less than 100 MHz, so that the frequencies are compatible.

If the angular phase difference between the main power source side and the auxiliary power source side is not minimised, then a significant increase in the active power flow of several megawatts (MW) can appear when the auxiliary switch is closed. The third condition is nearly the most important. Typically, the angular phase difference should at least be as close to 0° as possible. It is generally considered that a maximum deviation of +/−10° is admissible to obtain a compatible angular phase difference.

In the case where the measured electric data of the main power source and of auxiliary generator do not fulfil one of the above-mentioned compatibility conditions, the synchronisation step comprises a phase to correct the electric data relative to the auxiliary generator 20. This correction phase is implemented from the remote control station. It consists, for example, of gradually adjusting, i.e. in successive steps to avoid sudden variations, the parameters such as the speed of the motor and the voltage of the auxiliary generator, via a speed regulator and a voltage regulator of the auxiliary generator. The values such as the amplitude, the frequency and/or the angular phase of the auxiliary voltage are varied so that the differences between these values and the corresponding values of the primary voltage are compatible with a connection in parallel of the main and auxiliary power sources.

The remote control station therefore receives the measurements performed locally during the measuring phase and includes calculation and analysis software means to check if the measurements are compatible, i.e. if connection of the two sources in parallel is authorised, and possibly to act on the auxiliary generator 20 to make the necessary corrections.

When the conditions are met, the control method then provides a step to send an order to close the auxiliary switch 23 by the remote control station, then a step to send an order to open the main switch 13 by the remote control station, so as to switch the coupling network 5 over to the auxiliary power source 20.

Figure 2:
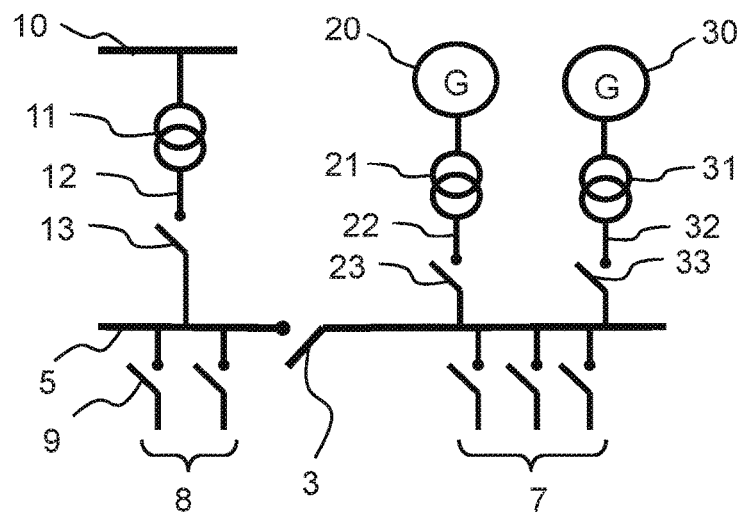
FIG. 2 shows a variant of FIG. 1 having a coupling switch and several auxiliary generators.

In the case where the auxiliary power source has several auxiliary generators 20, 30, respectively, as shown in FIG. 2, then the various synchronisation steps described above are to be performed for each auxiliary generator 20, 30, respectively, before being able to close the corresponding auxiliary switch 23, 33, respectively.

Once the coupling network 5 is powered solely by the auxiliary power source, the remote station conducts a checking step to verify that the unshed loads 7, 8 are correctly supplied by the auxiliary power source, notably by means of measurements performed on the coupling network 5. Although not detailed in this document, this step corresponds to the verification of basic known conditions of a power load flow, namely voltage and frequency of the system having values within the permissible range around their respective nominal value, and balance of the powers (active and reactive) produced and consumed.

Optionally, the method provides that if the electrical installation has priority loads 7 and their shutdown is not desired in order to perform a periodic availability verification of the auxiliary power source, the control method comprises a step to determine a power consumption $P_{LP}$ by all the priority loads 7 and a decision-making step, by the remote control station, that authorises the switchover of the main power source to the auxiliary power source only if this power consumed $P_{LP}$ by the priority loads 7 is less than the maximum power $P_{AUX}$ which can be supplied by the auxiliary generator(s) 20, 30 of the auxiliary power source.

In addition, if the electrical installation includes non-priority loads 8 that can be interrupted to perform a periodic availability verification of the auxiliary power source, the control method comprises an additional step before opening the main switch 13. This additional step is performed to determine powers consumed $P_{LNP}$ by the various non-priority loads 8 and a selective disconnection step which allows one or more non-priority loads 8 to be shed so that the sum of the powers consumed $P_{LP}$ by priority loads 7 and the power consumed $P_{LNP}$ by the unshed non-priority loads 8 are less than the maximum power $P_{AUX}$ that can be supplied by the auxiliary power source.

This selective disconnection step is performed by the remote control station which is thus able individually control the connection switches 9 of the non-priority loads 8 that may have to be shed.

Once the checking step is successful in verifying that the unshed loads 7, 8 are properly supplied by the auxiliary power source for a predetermined time, in the order of roughly ten seconds for example, this means that the correct operation of the auxiliary power source has been checked and that return to normal operating mode is possible.

To do this, the main power source and the auxiliary power source must once again be coupled in parallel so as to avoid an interruption in the supply of power to the loads. This is why the control method features a second step to synchronise the auxiliary power source with the main power source, comprising a phase to measure electric data relative to the main power source and to the auxiliary power source and a verification phase, from the remote control station, to ensure that the measured electric data of the main power source and the auxiliary power source are compatible. The process of this second synchronising step is similar to that of the first step for synchronising described above.

A variant is shown in FIG. 2, wherein the coupling network 5 includes a coupling switch 3 (also called a bus-tie) which separates the coupling network 5 into two parts. A first part includes the main power source 10 and the non-priority loads 8 and a second part includes the auxiliary generator(s) 20, 30 and the priority loads 7. The existence of this coupling switch 3 is completely independent as a result of having one or more auxiliary generators. Configurations different from that represented in FIG. 2 are thus conceivable, for example a coupling switch 3 and single auxiliary generator 20, or no coupling switch 3 and several auxiliary generators 20, 30.

In this variant, the control method comprises a step to determine a power consumed by the priority loads and by the non-priority loads, and a step to open the coupling switch, from the remote control station, to disconnect the non-priority loads in the case where the sum of the power consumed by the priority loads and the non-priority loads is greater than the available power supplied by the auxiliary power source.

Figure 3:
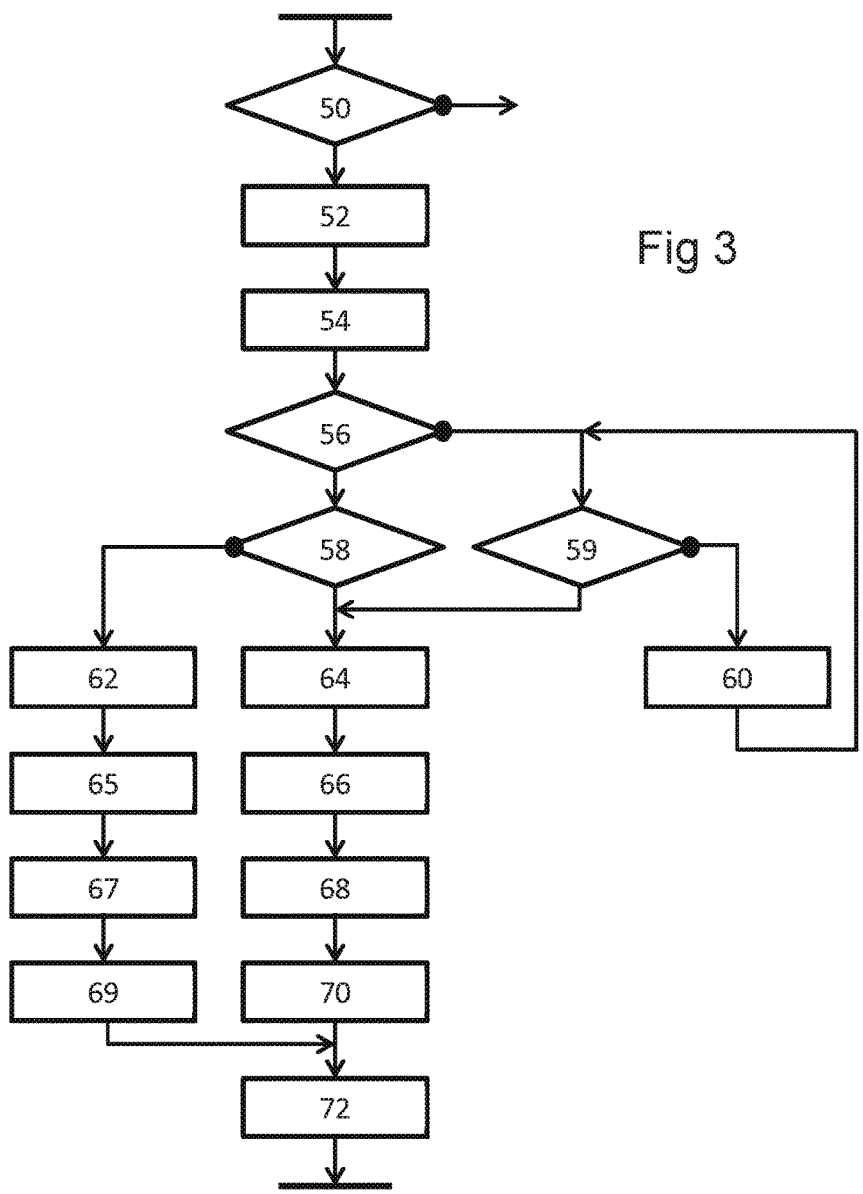
FIG. 3 is a simplified flowchart of the control method according to the invention.

FIG. 3 provides a simplified flow chart corresponding to an embodiment of the control method according to the invention. This flow chart is simplified because it does not include certain steps which would be obvious to the person skilled in the art, such as the starting or stopping of the auxiliary generator(s) of the auxiliary power source (generating unit), the calculating details of the maximum power that can be delivered by the auxiliary power source, the measurement of the power consumed at the moment of the test by the priority loads and/or the non-priority loads. The same is true for all possible exchanges involving event or status notification with the supervisory control and data acquisition centre (SCADA).

In this flowchart, the first block 50 is an initial test which is performed assuming there is no desire to continue the periodic maintenance operation if doing so will lead to a disconnection of certain priority loads. Block 50 thus represents the step to determine the power consumed $P_{LP}$ by the priority loads and the decision-making step authorising the implementation of the control method only if the power consumption $P_{LP}$ by the priority loads is less than the available power $P_{AUX}$ supplied by the auxiliary power source. If the test is positive ($P_{LP}<P_{AUX}$), the flowchart proceeds to block 52, otherwise the control method ends as this it means that the auxiliary power source will not be able, at this given time, to supply all the priority loads. In this case, the periodic maintenance test may be postponed to a more appropriate time.

Block 52 represents the first synchronisation step of the auxiliary power source with the main power source, including the possible correction phase, as required. Once the sources are synchronised, the next block 54 corresponds to the closure of the auxiliary switch(es) 20, 30 to connect the auxiliary power source the coupling network 5. The next block 56 is a test to determine whether or not the coupling network 5 has the option of a coupling switch 3 (bus-tie). If the electrical installation has a coupling switch 3, one moves to block 58, otherwise one proceeds to block 59.

The blocks 58 and 59 test if the sum of the powers consumed by the priority loads $P_{LP}$ and by the non-priority non-shed loads $P_{LNP}$ is less than the available power $P_{AUX}$ supplied by the auxiliary power source.

In the case of block 59 (without coupling switch 3), if the test is negative (i.e. $P_{LP}+P_{LNP}>P_{AUX}$), then one moves to block 60 which corresponds to the selective disconnection step enabling one or more non-priority loads to be disconnected by opening their connection switch 9. An iterative loop occurs on blocks 59 and 60, as long as the test of block 59 is not positive.

In the case of block 58 (with coupling switch 3), if the test is negative ($P_{LP}+P_{LNP}>P_{AUX}$), one then proceeds to block 62 wherein the coupling switch 3 opens so as to test the operation of the auxiliary power source to supply the priority loads 7 only. This case does not allow the correct operation of the main switch 13 to be tested (opening and closing) but nevertheless allows the correct operation of the coupling switch 3 to be tested. The flowchart then proceeds to block 65 where the checking step is performed to verify that the load(s) is/are correctly supplied by the auxiliary power source.

Once this checking step 65 is completed, the periodic maintenance operation can end and one thus proceeds to block 67 which corresponds to the second synchronisation step of the auxiliary power source with the main power source, including any phase correction, as required.

Once the second synchronisation step is completed in block 67, the next block 69 corresponds to the reclosure of the coupling switch 3 to again connect the main power source to the coupling network 5. During this block 69, the connection switches 9 of the possibly shed non-priority loads are closed. The next block will be block 72.

However, if the test carried out in the blocks 58 and 59 is positive ($P_{LP}+P_{LNP}<P_{AUX}$), then the flowchart proceeds to block 64 wherein the main switch 13 opens. The coupling network 5 is thus powered only by the auxiliary power source. The flowchart then proceeds to block 66 where the checking step is performed to verify that the load(s) is/are correctly supplied by the auxiliary power source.

Once this checking step 66 is completed, the periodic maintenance operation can end and one thus proceeds to block 68 which corresponds to the second synchronisation step of the auxiliary power source with the main power source, including any phase correction, as required.

Once the second synchronisation step is completed in block 68, the next block 70 corresponds to the closure of the coupling switch 13 to again connect the main power source to the coupling network 5. During this block 70, the connection switches 9 of the possibly shed non-priority loads are closed.

Finally, the last block 72 represents the step to open the auxiliary switch(es) so as to return to the installation to normal operating mode wherein all the loads 7, 8 are supplied by the main power source 10. Although not described in this flowchart, this step is followed by a step to stop the auxiliary generator(s). Finally, a report on the progress of the periodic maintenance test is printed and sent to the supervisory control and data acquisition centre.

The invention claimed is:

1. A method for controlling an electrical installation from a remote control station, the electrical installation comprising an electrical coupling network powering one or more electrical loads, a main switch to connect a main power source to the coupling network, and an auxiliary switch to connect an auxiliary power source to the coupling network, the control method including:
   a first step to synchronise the auxiliary power source with the main power source including a phase of measuring electric data relative to the main power source and to the auxiliary power source, and a verification phase, from the remote control station, to ensure that the measured electric data of the main power source and the auxiliary power source are compatible, a step to send an order to close the auxiliary switch from the remote control station, a step to send an order to open the main switch from the remote control station, and a step to check, from the remote control station, that load(s) is/are powered by the auxiliary power source.

2. The control method according to claim 1, wherein if, during the verification phase, the electric data measured relative to the main power source and to the auxiliary power source are not compatible, the synchronising step further comprises a phase to correct, from the remote control point, the parameters relative to the auxiliary power source.

3. The control method according to claim 1, wherein, after the checking step, the method further includes a second step to synchronise the auxiliary power source with the main power source comprising a phase to measure electric data relative to the main power source and to the auxiliary power source, and a verification phase, from the remote control station, to ensure that the electric data measured of the main power source and the auxiliary power source are compatible.

4. The control method according to claim 3, wherein, after the second synchronisation step, the method further includes a step to send an order to close the main switch from the remote control station, then a step to send an order to open the auxiliary switch from the remote control station.

5. The control method according to claim 1, wherein the electrical installation has several loads distributed between priority loads and non-priority loads, the method further comprising a step to determine a power consumed by the priority loads and a decision-making step that authorises the implementation of the control method only if the power consumed by the priority loads is less than an available power supplied by the auxiliary power source.

6. The control method according to claim 5, wherein each load is connected to the coupling network by a connection switch, the method further comprising a step to determine a power consumed by the priority loads and by the non-priority loads, and a selective disconnection step that allows one or more connection switches to be opened, from the remote control station, so that the sum of the power consumed by the priority loads and by the non-priority loads is less than the available power supplied by the auxiliary power source.

7. The control method according to claim 5, wherein the coupling network also has a coupling switch between the priority loads and the non-priority loads, the method further comprising a step to determine a power consumed by the priority loads and by the non-priority loads, and a step to open the coupling switch, from the remote control station, to disconnect the non-priority loads, in the case where the sum of the power consumed by the priority loads and the non-priority loads is greater than the available power supplied by the auxiliary power source.

8. The control method according to claim 1, wherein the method further includes a preliminary step of sending an order to start the auxiliary generator from the remote control station.

9. The control method according to claim 1, wherein the auxiliary source has several auxiliary generators each connected in parallel to the coupling network by an auxiliary switch.

10. The control method according to claim 1, wherein the electric data measured include the amplitude, the frequency, and the voltage angular phase of both the main power source and the auxiliary power source.

* * * * *